(12) United States Patent
Schwarzbauer

(10) Patent No.: US 8,110,927 B2
(45) Date of Patent: Feb. 7, 2012

(54) EXPLOSION-PROOF MODULE STRUCTURE FOR POWER COMPONENTS, PARTICULARLY POWER SEMICONDUCTOR COMPONENTS, AND PRODUCTION THEREOF

(75) Inventor: Herbert Schwarzbauer, München (DE)

(73) Assignee: Siemens Aktiengesellschaft, Munich (DE)

( * ) Notice: Subject to any disclaimer, the term of this patent is extended or adjusted under 35 U.S.C. 154(b) by 119 days.

(21) Appl. No.: 12/446,850

(22) PCT Filed: Nov. 20, 2007

(86) PCT No.: PCT/EP2007/062568
§ 371 (c)(1),
(2), (4) Date: Jun. 11, 2009

(87) PCT Pub. No.: WO2008/061980
PCT Pub. Date: May 29, 2008

(65) Prior Publication Data
US 2010/0314775 A1 Dec. 16, 2010

(30) Foreign Application Priority Data
Nov. 23, 2006 (DE) .......................... 10 2006 055 340

(51) Int. Cl.
*H01L 23/48* (2006.01)
(52) U.S. Cl. .................................. 257/774; 257/E23.01
(58) Field of Classification Search .................. 257/683, 257/774
See application file for complete search history.

(56) References Cited

U.S. PATENT DOCUMENTS

| | | | |
|---|---|---|---|
| 5,042,386 A | 8/1991 | Kruse et al. | |
| 5,977,621 A * | 11/1999 | Stuck | 257/683 |
| 6,324,072 B1 * | 11/2001 | Lorenz et al. | 361/803 |
| 7,221,004 B2 * | 5/2007 | Scholz et al. | 257/181 |
| 7,713,421 B2 * | 5/2010 | Galbraith | 210/663 |
| 2002/0060371 A1 * | 5/2002 | Lang | 257/785 |
| 2003/0025089 A1 | 2/2003 | Featherby et al. | |
| 2003/0122261 A1 * | 7/2003 | Bijlenga et al. | 257/777 |

FOREIGN PATENT DOCUMENTS

| | | | |
|---|---|---|---|
| JP | 5795650 A | | 6/1982 |
| JP | 60106150 A | | 6/1985 |
| JP | 63169056 A | * | 7/1988 |
| JP | 200660065 A | * | 1/2006 |

* cited by examiner

*Primary Examiner* — Steven Loke
*Assistant Examiner* — David Ziskind
(74) *Attorney, Agent, or Firm* — Laurence A. Greenberg; Werner H. Stemer; Ralph E. Locher

(57) ABSTRACT

A power module having at least one electric power component, such as a power electronic semiconductor component. An electrical contact for a load current is formed on a lower surface and also on an upper surface of the power semiconductor component. To reduce an explosion pressure and accept power when the power electronic semiconductor component is overloaded, a hollow space filled with at least one electrically conducting particle is formed on an electrical contact surface of the electrical contact. In case of a short circuit, an arc is initially generated above the semiconductor element thickness of the power semiconductor component, whereupon the filling in the hollow space takes over current conduction. Preferably, the filling in the hollow space is a plurality of spherical electrically conducting particles. The explosion pressure can escape into interstices in the filling if there is a short circuit. Furthermore, metal vapors are cooled and are condensed. A duct extending from and out of the hollow space can additionally be provided to reduce the explosion pressure, thus preventing power components from demolishing the surroundings during an electrical overload. The foregoing power module may be an improved thyristor.

18 Claims, 1 Drawing Sheet

US 8,110,927 B2

Figure 1:
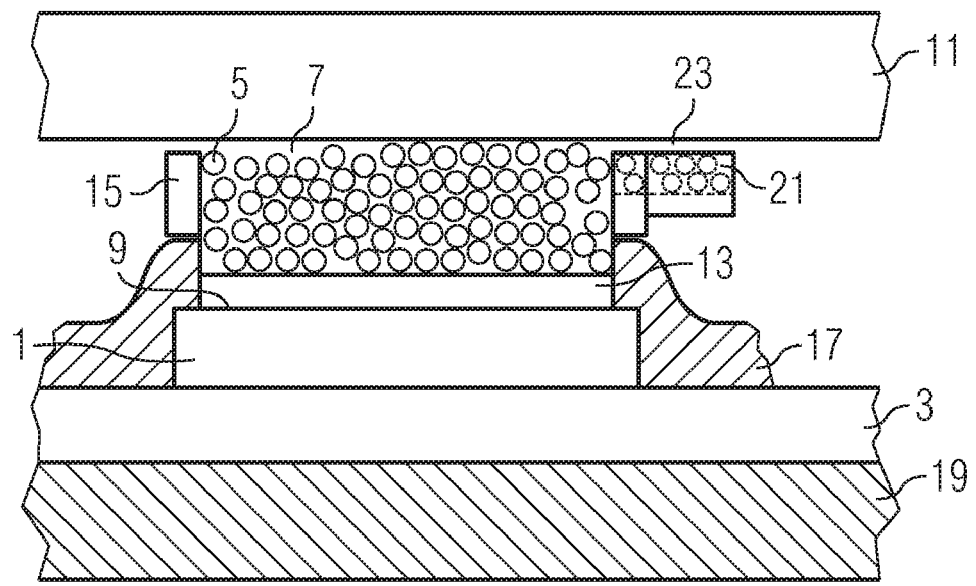

EXPLOSION-PROOF MODULE STRUCTURE FOR POWER COMPONENTS, PARTICULARLY POWER SEMICONDUCTOR COMPONENTS, AND PRODUCTION THEREOF

BACKGROUND OF THE INVENTION

Field of the Invention

The invention relates to power modules with at least one power component, especially an electrical power component, in accordance with the preamble of the main claim. Power components are all electrical or electronic components able to be used for high electrical currents or power. Described below are electronic power semiconductor components which are cited as typical examples for all possible power components.

In the conventional manner power modules, especially modules with power semiconductor components, are contacted by means of bonding. Power Semiconductor modules especially feature electronic power semiconductor components. These types of electronic power semiconductor components are used for the generation of controllable energy for large current loads and can switch large load currents. Power semiconductors are to be protected against overvoltage, a too rapid speed of increase of the voltage, short-circuit and thermal overloading. Especially in the event of a short-circuit in the load, the electronic power semiconductor components can be destroyed because of the short-circuit current. When the conventional bonding method is used, if a short-circuit occurs in the current load very high currents occur within a very short time in an electronic power semiconductor component. This can lead to a very strong heating up of the electronic power semiconductor components and also to the component melting. The conventional bond wires which conventionally feature aluminum also melt or are broken off as soon as encapsulation of the module is blown off as a result of the development of gas. Because of the tearing off for the electronic connection under high current flow a strong arc is immediately formed which, because of the explosive heating up, significantly increases the explosive effect, so that adjacent circuit parts can also be mechanically destroyed. On the explosion of emitter bonds a gate bonding frequently remains intact so that the voltage which drives the arc also affects the gate control via the gate lines and can destroy said lines. With a parallel connection of a number of power semiconductor components or power semiconductor modules the other power semiconductor components are activated by this voltage driving the arc by means of the respective gates. Although the voltage driving the arc is limited, the other power semiconductor components are overheated in this case since these then exhibit a high pass-through voltage on activation via a collector potential. The result is destruction of all power semiconductor components connected in parallel until the current flow is interrupted completely.

Conventionally series circuits of power semiconductor components are used for switching high-voltages.

In a series circuit a power semiconductor component operating as a switch does not remain open under any circumstances since otherwise the full voltage is present when it is switched on again. On the other hand a power semiconductor component operating as a switch may remain conductive in the event of a fault since then the full blocking voltage is present at the other power semiconductor components in the series circuit. Conventionally thyristors or also Insulated Gate Bipolar transistors (IGBT) are used for this purpose with a complicated pressure contacting, since this type of component does not explode when it melts but forms a weld zone with good conductivity which can continue to carry the current. The contact pressure is conventionally above 100 kp/cm².

BRIEF SUMMARY OF THE INVENTION

The object of the present invention is to provide components, especially power semiconductor components such as thyristors or IGBTs, such that said components, especially when used in power modules, on overload, for example on short-circuit, do not destroy their environment or any surrounding further components respectively. For example no associated gate controls and/or no adjacent circuit parts and/or no parallel switched power semiconductor components should be destroyed. Power semiconductor components are preferably used in a series circuit for switching high voltages.

The object is achieved by a power module in accordance with the main claim. A power module of this type is produced in accordance with the method claims.

If a power semiconductor component fails the explosion pressure can dissipate into the space the spaces between the particles in a cavity or with one particle into the space between particles and the boundaries of the cavity. Metal vapors are cooled and precipitated. There is preferably additional air in the cavity. With an electronic power semiconductor component the arc can only form over a maximum of one semiconductor thickness, especially silicon thickness of the electric power semiconductor component. Thereafter the current conducting is taken over by the particle or by the particles. A filling out of the arc point with metal would be desirable but this is however prevented by a flow of vapor from the arc. Although permanent current conducting in the event of a short-circuit cannot be securely created, the power module and the activation are not destroyed within a range of seconds by the explosion or a high feedback voltage via a gate line. A plurality of particles collected in the cavity can be referred to as a loose fill.

Further advantageous embodiments can be found in the subclaims.

In accordance with an advantageous embodiment a further electrically-conducting layer, especially a metal layer serving as strengthening, is formed on the electrical contact surface and the cavity is formed thereon. The power component is covered on another side with a metal layer with the thickness of between 20 to 50 or 100 or 200 μm, featuring copper, silver or nickel for example. In this way in particular a mechanical strengthening and an improved second electrical contacting to the electrical contact surface are provided.

In accordance with a further advantageous embodiment the power component on a substrate and the first electrical contacting from a side facing the substrate are created by means of at least one electrical conductor track arranged on the substrate. In this way a very compact arrangement is embodied.

In accordance with the further advantageous embodiment an electrical insulation layer is created in the areas surrounding the electrical contact surfaces or the electrically-conducting layer respectively of the electronic power component, of the electrical conductor track and of the substrate. The electrical insulation on the power component can for example be produced by means of a structured laminated-on insulation foil. In such cases the electrically-insulating plastic material is laminated onto the corresponding surfaces under vacuum, so that the foil covers the surface with the contact surface or surfaces by forming a close fit with it and adheres to this surface. Each electrical contact surface to be contacted is then revealed on the surface by opening respective windows in the foil and a full-surface contacting of each uncovered contact surface with the layout of the electrically-conducting material is undertaken. As regards the application of the electrical insulation layer, the reader is especially referred to WO03030247, the contents of which is included entirely in the contents of this application.

In accordance with the further advantageous embodiment a cover layer or a plate respectively is arranged on a frame and this is arranged around the electrical insulation layer and the electrical contact surface or the electrically-conducting layer so that a cavity is created and the plate and the electrical contact surface or the electrically-conductive layer are at a specific distance from each other. The height of the frame is small in such cases. The plate is arranged on the frame at a fixed distance from the electrical contact surface. The frame can both be provided lose or also be connected to the electrical insulation layer or to the plate. The frame can also be an element of the insulation layer or of the plate. The plate can be created as a stable cover layer, preferably from a material which conducts electricity well.

In accordance with a further advantageous embodiment the particles feature metal, especially hard metal. Likewise a specific size distribution can be created. Especially advantageously the particles are spherical. In this way a loose fill can be created especially homogeneously. This enables the behavior of the power module to be optimized in the event of a fault. Balls made from a hard metal distribute the pressure evenly. A large number, for example 50 to 300, of electrically-conducting particles is preferred. Basically the number is freely selectable.

In accordance with a further advantageous embodiment the space between plate and electrical contact surface or between plate and the electrically-conducting layer respectively is around three to four times the average cross-sectional extent of the particles. By carefully matching the distance between power component and cover layer or plate on the one hand and the diameter of the metal particles and their size distribution on the other, an even loose fill density can be achieved as from a distance of around three times to four times the diameter of the particles.

In accordance with a the further advantageous embodiment, to further reduce the explosion pressure during an overload of the power component, at least one channel is formed from the cavity to outside the cavity, with the largest channel cross-sectional extent being smaller than the smallest particle cross-sectional extent. The explosion pressure can be reduced by the filled cavity and the channel.

In accordance with a further embodiment all metal surfaces of the electrical contact surface, of the electrically conducting layer, of the metal particles and metallic plate feature a corrosion-proof and oxidation-proof contact metallization. If all these metal surfaces are covered by a corrosion-proof and oxidization-proof contact metallization, such as nickel, gold, ruthenium, rhodium, silver etc., the load current can be conducted from the power component via the metal loose fill directly to the plate. Since there is no firmly bonded connection, this contact is very resistant to fatigue caused by changes in temperature or load.

In accordance with a further advantageous embodiment the cavity is placed under a compression pressure, especially by means of pressure on a plate operating as a pressure plate, such that an electrical connection of electrical contact surface or electrically-conducting layer respectively is ensured by means of the metal particles to the plate. The compression pressure lies for example in the range of 5 to 10 kP/cm². In this way the creation of an additional current path is ensured.

Also in this way an innovative contacting system can be created which likewise makes reliable contacting possible for modules with individual power components in the same way as conventional pressure contact. A smaller contact pressure is merely required by comparison with the prior art. By this additional current-conducting level many additional conductor tracks can be avoided at the substrate level.

In accordance with a further advantageous embodiment the power component is an electronic power semiconductor component such as a thyristor, a triac, a diode or an Insulated-Gate-Bipolar-Transistor (IGBT).

In accordance with a further advantageous embodiment a gate of a power semiconductor component is contacted by means of an electrically-insulating metallic wire and/or a metallic spring in an electrically-insulating sleeve.

In accordance with a further advantageous embodiment a power module features a number of components which are arranged adjacent to each other on a substrate such that the respective cavities are delimited by a common electrically-conducting plate. In this way an additional current-conducting layer is produced by means of the electrically-conducting common plate so that many additional conductor tracks can be saved at the substrate level. The cover plate can extend over a number of power components or also over an entire power module.

In accordance with a further advantageous embodiment at least one channel is formed from at least one cavity to outside the cavity to reduce the explosive pressure, especially to at least one adjacent cavity. For example balls featuring a hard metal distribute the pressure evenly, for example via the channels within the frame from power component to power component. Channels can be created between the frame and the other parts of the structure. Channels serving to reduce the explosive pressure must merely be smaller than the smallest particle diameter.

In accordance with a further advantageous embodiment a compression pressure operates on the filled cavities by means of a common plate acting as a pressure plate. This can typically lie in the range of 5 through 10 kP/cm². In this way an innovative contacting system is produced such that an electrical connection of the electrical contact surface or electrically-conducting layer respectively to the plate is ensured by means of the electrically-conducting particles.

In accordance with a further advantageous embodiment the power components are connected electrically in series to enable them to switch high electrical voltages.

In accordance with a further advantageous embodiment the power components are activated in parallel. A parallel design of activation concept enables undamaged module parts to be switched to permanent short-circuit, during a short-circuit for example, and the series circuit of the power components to continue its operation.

In accordance with a further advantageous embodiment the particles are introduced into the cavity via a least one filler channel and/or before the cover layer is applied. This means that the volume in the frame between power component surface and plate is the filled up for example with individual metal particles, preferably balls, through a filler opening in the frame, in the plate or even before assembly. This simplifies the filling of the cavities.

The present invention will be described below in greater detail on the basis of exemplary embodiments in conjunction with the figures. The figures show:

BRIEF DESCRIPTION OF THE SEVERAL
VIEWS OF THE DRAWING

Figure 2:
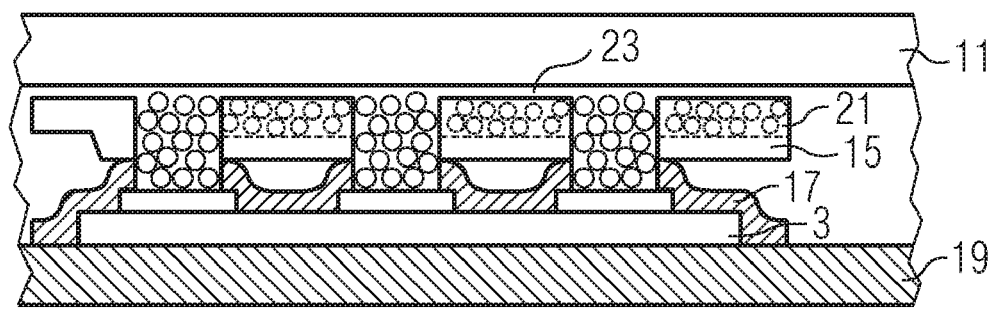

FIG. 1 a first exemplary embodiment of an inventive power module;

FIG. 2 a second exemplary embodiment of an inventive power module.

DESCRIPTION OF THE INVENTION

FIG. 1 shows a first exemplary embodiment of an inventive power module. In accordance with this explosion-proof module structure, an explosion pressure can be dissipated by a filling consisting of the electrically-conducting particles 5, for example metal balls with a diameter of 0.5 to 2 mm, and a channel 23 for pressure reduction, with the channel 23 for pressure reduction being created along a frame 15. In accordance with this exemplary embodiment, a power component, especially an electronic power semiconductor component 1 is produced with an electrical contacting generated on an underside of the power semiconductor component 1 for a load current. In addition on another side of the power semiconductor component 1 a second electrical contacting for a load current is created by means of an electrical contact surface 9. The power semiconductor component 1 is arranged on a substrate 19. The first electrical contacting is from a side facing the substrate to 19 by means of at least one electrical conductor track 3 arranged on the substrate 19. The electrical conductor track can for example be a copper conductor track. Comparable materials can also be used. To reduce an explosive pressure and to accept the power on overload of the power semiconductor component 1 a cavity 7 filled with at least one electrically-conducting particle 5 is embodied on the electrical contact surface 9. Preferably a plurality of electrically-conducting particles 5 will be used. In such cases the particles 5 can be created as a loose fill. The number of particles 5 can for example lie in the range of 100 to 1000 particles. The number of particles 5 depends on the size of the particles 5 and the volume of the cavity 7. In the spaces between the electrically-conducting particles 5 the explosive pressure can dissipate on the failure of the power semiconductor component 1, metal vapor is cooled and precipitated. In addition to the particle or particles 5, there can preferably be air in the cavity 7. Alternatively gases can also be used. In the event of a short-circuit an arc can merely form over a maximum of the thickness of the power semiconductor component 1 then that the current conducting is taken over by the electrically-conducting particles 5 or by the plurality of electrically-conducting particles 5 respectively. Basically just one electrically-conducting particle 5 can be created in a cavity 7. It must however be produced as regards form and materials such that the current conducting can be taken over by the electrically-conducting particle 5. Preferably a loose fill of electrically-conducting particles 5 is used. In accordance with the exemplary embodiment shown in FIG. 1 a further electrically-conducting layer 13 embodied as a metal layer serving as a strengthening is embodied on the electrical contact surface 9 and the cavity 7 is embodied on it. It is additionally ensured by this metal layer 13 that the current conducting can be taken over by the particle or by the particles 5 respectively. In addition the explosion pressure will be passed on by the metal layer 13 to the spaces of the electrically-conducting particles 5.

In addition an electrical insulation layer 17 is created on the areas of the electronic power semiconductor component 1, the electrical conductor track 3 and a substrate 19 surrounding the electrical contact surface 9 or the metal layer 13 respectively. In this way parallel currents are prevented from flowing to the power semiconductor component 1 between conductor tracks 3 and electrical contact surface 9 or metal layer respectively 13. In this way the short-circuit current flowing through the power semiconductor component 1, in the event of a short-circuit, can be taken up by the particles 5. The electrical insulation layer can be created for example in accordance with WO 03030247. In addition the sequence of layers substrate 19, conductor track 3, power semiconductor component 1, metal reinforcement 13 and insulation 17 can be created in accordance with WO 03030247. The following steps are performed: Laminating a foil 17 of electrically-insulating plastic material onto the surfaces of the substrate 19, the conductor track 3 and the power semiconductor component 1 in a vacuum, so that the foil 17 forms a close-fit over on the surfaces with the electrical contact surface and adheres to this surface, revealing each electrical contact surface 9 to be contacted on the surface by opening respective windows in the foil 17 and full-surface contacting of each electrical contact surface 9 revealed with a layer 13 of the electrically-insulating material. In accordance with the exemplary embodiments depicted in FIG. 1, the cavity 7 is created by means of a plate on the frame 15. The frame 15 is arranged on the electrical insulation layer 17 around the electrical contact surface 9 or the metal layer 13 respectively. In this way plate 11 and electrical contact surface 9 or metal layer 13 respectively are created at a specific distance from each other. The plate 11 can for example be created as a cover layer. The plate 11 can be screwed insulated to a module base or the substrate 19 respectively. The substrate 19 can be produced from ceramic insulation for example. The electrically-conducting particles 5 especially feature metal, especially hard metal and/or a specific size distribution. Furthermore the particles 5 can be spherical in shape. Especially advantageous is a plurality of particles 5 which especially create a loose fill. Especially advantageously the space between plate 11 and electrical contact surface 9 or metal layer 13 respectively is three to four times the average particle cross-sectional extent. For further reduction of an explosion pressure in the event of an overload of the power semiconductor component 1, at least one channel 23 to outside the cavity 7 is embodied out of the cavity 7. So that the electrically-conducting particles 5 do not escape from the cavity, the largest channel cross-sectional extent is smaller than the smallest particle cross-sectional extent. Thus in this explosion-proof module structure an explosion pressure can be dissipated by the filling of the electrically-conducting particles 5 and the channel 23 into or onto frame 15. The frame 15 is either arranged loosely on the insulation layer 17 or is a component of the insulation 17 or of the plate 11. Especially advantageously the plate 11 is provided as a pressure plate. In this way cavity 7 is put under a compression pressure such that an electrical connection from electrical contact surface 9 or metal layer 13 respectively by means of the electrically-conducting particles 5 to the electrically-conducting plate 11 is ensured, especially if the surfaces of electrical contact surface 9, of metal layer 13, of the particles 5 and plate 11 have a corrosion-proof and/or oxidation-proof contact metallization. In this way a current-conducting layer in addition to the current-conducting layer of the conductor tracks 3 on the substrate 19 can be produced. Electronic power semiconductor components 1 can typically be a thyristor, a triac or an Insulated-Gate-Bipolar-Transistor (IGBT). Furthermore a gate of a power semiconductor component 1 is electrically contacted by means of an electrically-insulated, electrically-conducting wire and/or an electrically-conducting spring in an electrically-insulating sleeve. FIG. 1 also shows a channel 21 for introducing the filling of particles 5. Channel 21 is closed off after filling or is used after being made narrower as channel 23 for explosion pressure reduction.

FIG. 2 shows a second exemplary embodiment of an inventive power module. A number of electronic power semiconductor components 1 are arranged adjacent to each on a substrate 19 such that the respective associated cavities 7 are delimited by a common electrically-conducting plate 11. FIG. 2 shows a substrate 19, which for example is created from a ceramic. Reference character 3 shows an electrical conductor track, for example a copper conductor track. Reference character 17 shows a common insulation layer 17 of the three power semiconductor components 1. Created on the electronic power semiconductor components 1 is a frame 15, an electrically-conducting pressure plate 11 in each case. The pressure plate can be created as a metal pressure plate 11. Reference character 21 indicates a fill channel for filling the cavity with the electrically-conducting particles 5. In accordance with FIG. 2 a least one channel 23 is embodied for pressure reduction, from at least one cavity 7 to outside the cavity 7 or to at least one adjacent cavity 7. A compression pressure acting by means of a least one common electrically-conducting plate 11 operating as a pressure plate acts on the cavities 7. If the surfaces of electrical contact surfaces 9, of metal layer 13, of particles 5 and plate 11 have a corrosion-proof and/or oxidation-proof contact metallization, an electrical connection to the plate 11 from electrical contact surfaces 9 or metal layer 13 can be ensured be means of the particles 5. In this way an additional current-conducting level for a plurality of electronic power semiconductor components 1 is created. FIG. 2 shows a multi-power semiconductor component module with an end-to-end conducting pressure plate 11 as a current-conducting layer. The frames 15 are arranged fixed on the power semiconductor component insulation 17 to ensure the electrical insulation and creation of a creepage gap. The cavity is filled with the electrically-conducting particles 5, which are balls here for example, through a common channel 21. Channel 21 can be closed off after filling or narrowed in cross-section into a channel 23 for reducing the explosion pressure. In accordance with an advantageous embodiment to the electronic power semiconductor components 1 are connected electrically in series. In this way high voltages can be switched. Furthermore the electronic power semiconductor components 1 are especially advantageously activated in parallel. In this way, in the event of a short-circuit, undamaged power semiconductor components 1 can be switched to permanent short-circuit and a series circuit of the electronic power semiconductor components 1 can continue its operation. A switch may remain conductive in the event of a full sense then the intact power semiconductor component 1 in the series circuit can take over the full blocking voltage. In this way destruction of an activation device can also be avoided.

The invention claimed is:

1. A power module comprising:
   a power component including at least one electronic power semiconductor component having an upperside and an underside;
   a first electrical contact formed on said underside for a load current;
   a second electrical contact surface formed on said upperside for a load current; and
   a cavity having at least one electrically-conducting particle being embodied on said electrical contact surface for reducing an explosion pressure and for accepting power on overload of the power component;
   said cavity formed by a plate on a frame that is arranged on an electrical insulation layer, and said electrical insulation layer arranged around said electrical contact surface; and
   said plate and said electrical contact surface arranged at a specific distance from each other.

2. The power module according to claim 1, including a further electrical-conducting metal layer being formed on said electrical contact surface and said cavity being formed thereon.

3. The power module according to claim 1, including a substrate, at least one electrical conductor track being arranged on said substrate, said power component being formed on said substrate and said first electrical contact being formed from a side facing said substrate.

4. The power module according to claim 3, including an electrical insulation layer being formed in an area of said electronic power component, said electrical conductor track and said substrate surrounding one of said electrical contact surface or said layer respectively.

5. The power module according to claim 1, including a plurality of electrically-conducting particles, said particles being hard metal and having at least one of a specific size distribution or being spherical in shape.

6. The power module according to claim 1, wherein the distance is about three to four times the average particle cross-section.

7. The power module according to claim 1, including at least one channel extending from said cavity to outside said cavity, to at least one adjacent cavity, the largest cross-sectional extent of said channel being smaller than the smallest particle cross-sectional for further reduction of an explosion pressure in the event of an overload of said power component.

8. The power module according to claim 1, wherein at least said electrical contact surface has a corrosion-proof oxidation-proof contact metallization.

9. The power module according to claim 1, wherein said cavity is under a compression pressure on said plate such that an electrical connection from one of said electrical contact surface or said layer respectively to said plate is formed by the electrically-conducting particles.

10. The power module according to claim 1, wherein said electronic power semiconductor component is one of a thyristor, a triac, a diode or an Insulated-Gate-Bipolar-Transistor.

11. The power module according to claim 1, wherein said power semiconductor component includes a gate that is contacted by an electrically-insulating, electrically-conducting wire and/or an electrically-conducting spring in an electrically-insulating sleeve.

12. The power module according to claim 3, including a plurality of power components arranged next to each other on said substrate such that the respective cavities are delimited by a common electrically-conducting plate.

13. The power module according to claim 12, including at least one channel extending from at least one cavity to outside at least one adjacent cavity to reduce explosion pressure.

14. The power module according to claim 12, including a common electrical conducting pressure plate applying compression pressure on said cavities.

15. The power module according to claim 12, wherein said power components are connected electrically in series.

16. The power module according to claim 12, wherein said power components are activated in parallel.

17. A method for producing a power module: according to the following steps:
   providing a power module as recited in claim 1;
   forming a first electrical contact for a load current on the underside of the power component,
   forming a second electrical contact surface for a load current, and forming a cavity by arranging a plate on a frame located on an electrical insulation layer disposed around the electrical contact surface; wherein the plate and the electrical contact surface are arranged at a specific distance from each other;

using the cavity for reducing an explosion pressure and for accepting power on overload of the power component, on the electrical contact surface; and filling the cavity with a least one electrically-conducting particle.

18. The method for producing a power module according to claim 17, including the further steps of introducing electrically-conducting particles into the cavity through at least one fill channel and/or before fitting the plate to form the cavity.

* * * * *